United States Patent [19]

Schladitz

[11] 4,076,859
[45] Feb. 28, 1978

[54] PROCESS FOR METALLIZING STRIPS, SHEETS OR THE LIKE

[75] Inventor: Hermann Johannes Schladitz, Munich, Germany

[73] Assignee: Schladitz-Whiskers AG, Zug, Switzerland

[21] Appl. No.: 598,337

[22] Filed: Jul. 23, 1975

Related U.S. Application Data

[62] Division of Ser. No. 486,956, Jul. 10, 1974, abandoned.

[30] Foreign Application Priority Data

Aug. 29, 1973 Germany .............................. 2342499

[51] Int. Cl.² ........................................... C23C 11/02
[52] U.S. Cl. ...................................... 427/55; 427/252
[58] Field of Search .................. 427/55, 251, 252, 253

[56] References Cited

U.S. PATENT DOCUMENTS

2,986,115  5/1961  Toulmin ........................... 427/251 X
3,627,590  12/1971  Mammel ....................... 118/49.5 UX

FOREIGN PATENT DOCUMENTS

938,699  10/1963  United Kingdom ............... 118/49.5

Primary Examiner—Bernard D. Pianalto
Attorney, Agent, or Firm—Oblon, Fisher, Spivak, McClelland & Maier

[57] ABSTRACT

A process for metallizing strips, sheets or other generally flat material by depositing metal from an atmosphere containing a gaseous metallic compound is disclosed. According to the metallizing process, a focal line extending within or closely adjacent to the surface to be metallized is established by an optical system. Thermal energy is focused at this focal line by the optical system to create a line at which the temperature is above the decomposition temperature of the gaseous metallic compound. Since heating is substantially confined to the focal line, the method of the invention provides a significant advantage in that the material to be metallized is not raised to the decomposition temperature. Accordingly the present invention provides a metallizing process which does not require the use of evacuated enclosures and does not require a high temperature tolerance in the materials to be metallized.

2 Claims, 2 Drawing Figures

U.S. Patent  Feb. 28, 1978  4,076,859
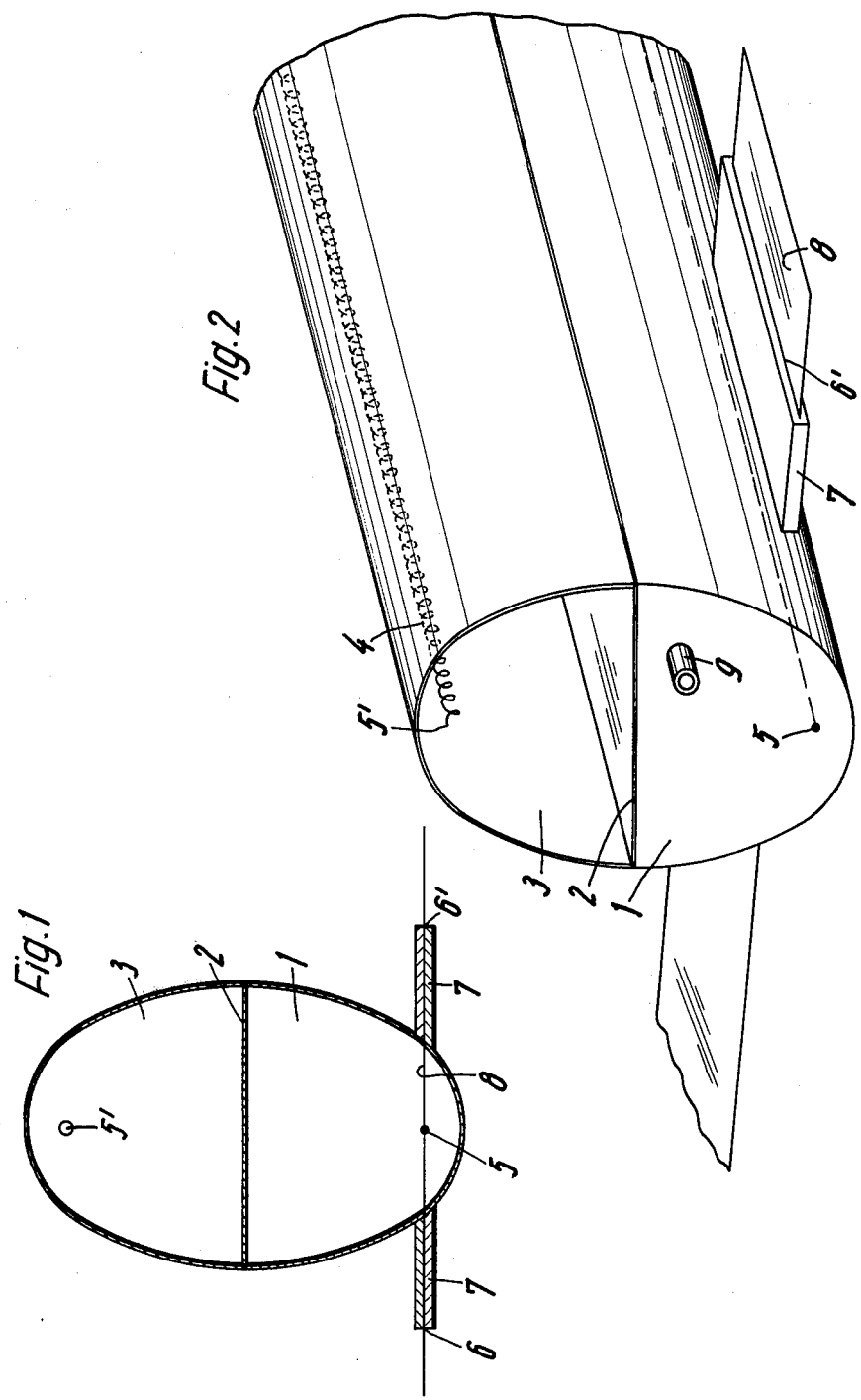

PROCESS FOR METALLIZING STRIPS, SHEETS OR THE LIKE

This is a division of application Ser. No. 486,956, filed July 10, 1974, now abandoned.

The present invention relates to a process and an apparatus for metallizing strips, sheets or the like, particularly strip material continuously passing through a metallizing device by decomposing gaseous metallic compound.

Apparatuses of the afore-mentioned type are already known, showing the disadvantage that the quality and the thickness of the coating produced on strips, sheets or the like varies or differs substantially. As a consequence of depositing the metal on a large surface on account of thermal decomposition of the gaseous metallic compound an important irregularity is caused with regard to the quantity of the decomposed metal as well as to its crystalline structure, depending i.a. on the local conditions (rate of nucleus formation, irregularities or the like) at the surface to be metallized. Generally an undesired, coarse-crystalline structure is generated which shows variations in the side of its crystals.

The technical art furthermore requires a considerable heating-up of the whole material, as the current gaseous metallic compound, for example, metal carbonyles, show relatively high decomposition temperature, at which some of the materials, which are to be metallized, become already plastic or suffer other undesirable changes as to their properties; furthermore, the amount of energy required for heating the material over the whole cross-section up to the decomposition temperature of the gaseous metallic compound is very high. Local difference during heating the material cause further irregularities as to temperature and amount of metal deposited in the different areas of the strip. If the strips, sheets or the like attain the decomposition-temperature only in a thin surface region, whilst the interior of the strip remains at a rather low temperature, the metallizing process may be interrupted on account of the endothermic reaction in those parts of the metallizing chamber which are being crossed after the surface temperature has been reduced below decomposition-temperature, because no heat can be delivered from the interior of the material.

Object of the present invention is to provide more reproducible and constant decomposition conditions for the metal coating and to avoid an extreme overheating of the passing material as well as special heating chambers.

The heretofore existing problems are solved by moving the surface to be metallized through at least one focal line of an optical system in transverse direction to the said focal line, the focal line of the surface area to be metallized extending either in this surface or parallel and close to this surface. The expression "close" means that the focal line is situated so close to the surface that the temperature created at the adjacent surface region is sufficient to effect the decomposing of the gaseous metallic compound.

The present invention provides furthermore an apparatus for carrying out the process. According to one preferred embodiment of the apparatus the metallizing chamber, in which at least one focal line, collecting heat radiation is arranged, provides opposite slotted holes in its walls, running parallel to each other and to the focal line. The slotted holes for leading the said passing material are preferably constructed like sluices. As it is already known, the metallizing chamber provides inlets and outlets for the gaseous metallic compound.

According to an especially advantageous embodiment of the invention the metallizing chamber has the shape of a tube cross-section closed at its ends. The lower part of the tube is separated from the upper part by an intermediate wall transparent to heat radiation. The walls of the tube show reflecting qualities, which can be improved by coating the walls for example with a thin silver layer. Lateral openings for the passing material limit the reflector-area of the tube walls. This, however, is not very important if the focal line is arranged close to the tube bottom.

The radiation source is preferably arranged in a chamber with an elliptical cross-section which has also the effect of a focal reflector having a reflecting interior surface. As a consequence of the metallizing chamber being closed as to the radiation source no condensation of the gaseous metallic compound can take place at the radiation source. The chamber, in which the radiation source is located, should not be closed at its ends as this could reduce the cooling effect as to the connections and the air surrounding the radiation source.

It goes without saying that more than one focal line may be also provided in the metallizing chamber. These focal lines must be arranged parallel to each other in a common plane defined by the plane of the passing material. In this case a plurality of metallizing zones are available.

Preferably the material to be metallized has a plane-like shape, if the focal line has a shape of a straight line. If strips, sheets or the like have a developable bent surface the focal line may be correspondingly provided as a curved line. As it is known already, this can be achieved by a corresponding construction of the optical system.

It is furthermore possible to effect a reciprocating motion transvers to the focal line if strips, sheets or the like have smaller sizes. In this case the coat is deposited during a number of cyclic motions, so that the thickness of the coating can be controlled by the number of the cyclic motions.

The present invention has the advantage that the heat is concentrated right at that point were the metal decomposition shall be effected. The fact that the focal line contacts the surface of the passing material causes exactly defined decomposition conditions along the focal line which are widely independent from the pretreatment of the passing material. The inner temperature of the metallizing chamber may remain relatively low so that no injurious decomposition of the metal, for example, at other points of the chamber may arise. The heating of the whole cross-section of the material becomes completely superfluous as the necessary heat to attain decomposition-temperature is achieved, at a well defined surface region. A short overheating in the decomposition region is generally not injurious if the passing velocity of the material is high enough. The possibility to apply relative high temperatures near the decomposition line improves the decomposition conditions and results in depositing relatively small crystalits adhering very well on the surface of the passing material.

Apparatuses for metallizing of passing mineral fibers providing an optical system with two focal lines, are already known. In this case the filament of the fibrous material is arranged in the one, the linear radiation source in the other focal line. This well-known arrangement, however, was not intended for the metallizing of wide surface areas of materials nor could an optical system with linear focal lines be considered suitable for metallizing surface areas or flat materials.

The present invention is described in detail by way of an example in the attached drawing:

FIG. 1 shows a sectional view of the inventive apparatus perpendicular to the focal lines of the system;

FIG. 2 shows a perspective side view of the apparatuse according to FIG. 1.

The metallizing chamber 1 consists of an elliptical tube being closed on its upper side by means of a cover 2 which is transparent for heat radiation. A teflon cover 2 is connected with the tube 1 by means of an adhesive or by welding. Above the metallizing chamber 1 an open elliptical metallic tube section 3 is arranged providing within the focal line 5' a radiation source, which may for example consist of an electrically heated spiral wire 4. Slot-shaped openings 6 are provided laterally and parallely to the focal line 5 of the metallizing chamber 1 allowing the passing of strips, sheets or the like. In this case the slotted holes 6 are connected with sluices 7, shown schematically. These sluices serve to minimize the losses of the gaseous metallic compound. During the passing of the material through the slotted holes 6 and 6' metallizing of the surface 8 of the material is effected. The admission of metallizing gases is effected by means of a stud-like inlet 9, which is arranged at the side wall of the chamber 1.

What I claim is:

1. A process for metallizing strips, sheets or other generally flat material by depositing metal out of an atmosphere containing a gaseous metallic compound, consisting essentially of the steps of:

providing a heat decomposable gaseous metallic compound;

providing a focal line closely adjacent to or on one surface of said material to be metallized using an optical system, focusing heat radiation at the focal line to heat said focal line to a temperature above the decomposition temperature of said gaseous metallic compound whereby metal for deposition is produced from said compound along said focal line, said step of heating being carried out such that heat is substantially confined to said focal line adjacent to or on said one surface and the heating of said material is substantially confined to said one surface such that the temperature of the entire cross section of said material being metallized is not raised to said decomposition temperature; and, continuously moving said material to be metallized transversely past said focal line to accomplish surface metallization thereof.

2. A process according to claim 1, wherein:

said focal line lies on the surface of the material to be metallized.

* * * * *